United States Patent
Davis et al.

(10) Patent No.: US 11,844,190 B2
(45) Date of Patent: Dec. 12, 2023

(54) TOP OF STACK SAFETY RAIL

(71) Applicant: Dell Products L.P., Round Rock, TX (US)

(72) Inventors: James Samuel Davis, Georgetown, TX (US); Kelly A. Thiessen, Austin, TX (US); Gregory M. Vinson, Bulverde, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/479,000

(22) Filed: Sep. 20, 2021

(65) Prior Publication Data
US 2023/0092329 A1    Mar. 23, 2023

(51) Int. Cl.
*H05K 7/18*    (2006.01)
*H05K 7/14*    (2006.01)

(52) U.S. Cl.
CPC .......... *H05K 7/183* (2013.01); *H05K 7/1489* (2013.01); *H05K 7/186* (2013.01)

(58) Field of Classification Search
CPC .......... H05K 7/18; H05K 7/183; H05K 7/186; H05K 7/1489
See application file for complete search history.

(56) References Cited

U.S. PATENT DOCUMENTS

| | | | | |
|---|---|---|---|---|
| 321,078 A * | 6/1885 | Birckhead | ............... | A47B 88/48 312/298 |
| 2,566,186 A * | 8/1951 | Gillett | ............... | A47B 88/48 292/37 |
| 3,133,768 A * | 5/1964 | Klakovich | ........... | H05K 7/1489 312/334.8 |
| 3,975,071 A * | 8/1976 | Quinn | ............... | A47B 88/48 108/143 |
| 4,193,649 A * | 3/1980 | Sharon | ............... | A47B 88/407 248/248 |
| 4,441,771 A * | 4/1984 | Roesler | ............... | A47B 88/60 312/330.1 |
| 4,453,790 A * | 6/1984 | Cohen | ............... | A47B 88/57 312/334.44 |
| 5,213,401 A * | 5/1993 | Hatcher | ............. | A47B 21/0314 361/679.08 |
| 5,226,714 A * | 7/1993 | Wright | ............... | A47B 88/48 312/331 |
| 5,348,207 A * | 9/1994 | Frank | ............... | B60R 9/055 224/310 |

(Continued)

FOREIGN PATENT DOCUMENTS

CA    2529111 A1 *    6/2007    ............. H04Q 1/023

*Primary Examiner* — Stanton L Krycinski
(74) *Attorney, Agent, or Firm* — Terrile, Cannatti & Chambers; Stephen A. Terrile (57) ABSTRACT

A top of stack mounting component. The top of stack mounting component includes a side portion, the side portion being configured to be mounted to a side of a rack; and, an information handling system retention member, the information handing system retention member preventing upward movement of an information handling system as the information handling system is removed from the rack and passes a potential tipping point where more weight of the information handling system is out of the rack as compared to the portion of the weight of the information handling system which is within the rack.

20 Claims, 8 Drawing Sheets

(56) References Cited

U.S. PATENT DOCUMENTS

| | | | | |
|---|---|---|---|---|
| 5,833,337 A * | 11/1998 | Kofstad | ............... | H05K 7/1489 211/175 |
| 5,941,621 A * | 8/1999 | Boulay | ............... | H05K 7/1421 312/334.4 |
| 6,123,303 A * | 9/2000 | Huang | ............... | A47B 96/025 211/90.02 |
| 6,209,979 B1 * | 4/2001 | Fall | ............... | H05K 7/1489 312/319.1 |
| 6,497,465 B1 * | 12/2002 | Baker | ............... | H05K 7/1421 312/334.4 |
| 6,644,481 B2 * | 11/2003 | Dean | ............... | H05K 7/1489 312/348.2 |
| 6,739,682 B2 * | 5/2004 | Shih | ............... | H05K 7/1421 312/334.4 |
| 7,090,316 B2 * | 8/2006 | Model | ............... | A47B 88/60 312/328 |
| 7,134,558 B1 * | 11/2006 | Mimlitch, III | ............... | H05K 7/1489 211/189 |
| 7,140,703 B1 * | 11/2006 | Holdgate, III | ............... | A47B 88/48 312/330.1 |
| 7,762,411 B2 * | 7/2010 | Hilburn | ............... | A47B 88/43 211/192 |
| 7,780,253 B1 * | 8/2010 | Lu | ............... | H05K 7/183 312/334.4 |
| 7,806,277 B2 * | 10/2010 | Mimlitch, III | ............... | H05K 7/1421 211/26 |
| 7,963,408 B2 * | 6/2011 | Glover | ............... | A47B 88/57 312/334.7 |
| 8,118,178 B2 * | 2/2012 | Olesiewicz | ............... | H05K 7/183 312/334.5 |
| 8,358,502 B2 * | 1/2013 | Gomez | ............... | H05K 7/1489 248/183.3 |
| 8,562,086 B1 * | 10/2013 | Baik | ............... | A47B 88/931 312/334.4 |
| 8,701,902 B2 * | 4/2014 | Oura | ............... | H05K 7/1421 312/334.3 |
| 8,727,138 B2 * | 5/2014 | Dittus | ............... | H05K 7/183 312/334.4 |
| 9,131,773 B2 * | 9/2015 | Tsai | ............... | A47B 88/931 |
| 9,237,671 B2 * | 1/2016 | Chen | ............... | H05K 7/1489 |
| 9,326,414 B2 * | 4/2016 | Eberle, Jr. | ............... | H05K 7/1491 |
| 9,668,577 B2 * | 6/2017 | Chen | ............... | A47B 96/067 |
| 9,913,396 B2 * | 3/2018 | Chen | ............... | H05K 7/1489 |
| 9,992,903 B1 * | 6/2018 | Dufresne | ............... | H05K 7/1487 |
| 10,080,306 B2 * | 9/2018 | Dennison | ............... | A47B 88/43 |
| 10,159,164 B2 * | 12/2018 | Liao | ............... | A47B 88/43 |
| 10,376,055 B2 * | 8/2019 | Chen | ............... | H05K 7/183 |
| 10,959,520 B2 * | 3/2021 | Filipowicz | ............... | A47B 88/60 |
| 11,160,189 B2 * | 10/2021 | Yu | ............... | H05K 7/183 |
| 2002/0084734 A1 * | 7/2002 | Shih | ............... | H05K 7/1489 312/334.7 |
| 2003/0193781 A1 * | 10/2003 | Mori | ............... | H05K 7/1489 361/725 |
| 2005/0088069 A1 * | 4/2005 | Greenwald | ............... | A47B 88/49 312/333 |
| 2006/0157436 A1 * | 7/2006 | Iwamoto | ............... | A47B 57/30 211/26 |
| 2006/0283816 A1 * | 12/2006 | Moore | ............... | A47B 57/48 211/26 |
| 2007/0063626 A1 * | 3/2007 | Scott | ............... | A47B 88/487 312/334.7 |
| 2012/0161599 A1 * | 6/2012 | Chen | ............... | H05K 7/1489 312/333 |
| 2013/0020225 A1 * | 1/2013 | Zabinski | ............... | A47B 88/48 206/557 |
| 2014/0175033 A1 * | 6/2014 | Chen | ............... | H05K 7/183 211/49.1 |
| 2016/0316585 A1 * | 10/2016 | Lu | ............... | H05K 7/1489 |
| 2020/0275578 A1 * | 8/2020 | Murakami | ............... | H05K 7/1489 |
| 2021/0051814 A1 * | 2/2021 | Carver | ............... | H05K 7/1489 |
| 2022/0087421 A1 * | 3/2022 | Chen | ............... | H05K 7/183 |

\* cited by examiner

TOP OF STACK SAFETY RAIL

BACKGROUND OF THE INVENTION

Field of the Invention

The present invention relates to information handling systems. More specifically, embodiments of the invention relate to server racks within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method are disclosed for providing a top of stack safety rail.

In one embodiment, the invention relates to a top of stack mounting component, comprising: a side portion, the side portion being configured to be mounted to a side of a rack; and, an information handling system retention member, the information handing system retention member preventing upward movement of an information handling system as the information handling system is removed from the rack and passes a potential tipping point where more weight of the information handling system is out of the rack as compared to the portion of the weight of the information handling system which is within the rack.

In another embodiment, the invention relates to a rack comprising: a first side panel and a second side panel; a top panel attached to the first side panel and the second side panel; a bottom panel attached to the first side panel and the second side panel; and, a top of stack mounting component, the top of stack mounting component being positioned in the rack at the top most information handling system mounting location, the top of stack mounting component comprising: a side portion, the side portion being configured to be mounted to one of the first side panel and the second side panel; and, an information handling system retention member, the information handing system retention member preventing upward movement of an information handling system as the information handling system is removed from the rack and passes a potential tipping point where more weight of the information handling system is out of the rack as compared to the portion of the weight of the information handling system which is within the rack.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Various aspects of the disclosure include an appreciation that certain server or storage type information handling systems do not have sliding rail systems, and only have static rail systems. Due to the system weight, sliding rails can lack the structural integrity needed for safe installations. This can be an especially challenging issue for information handling systems which are mounted in the topmost U space in the rack. With this mounting location it is likely that server can tip forward sooner than the technician expects due to a front-heavy weight distribution. This risk applies to all heavy server or storage type information handling systems which are mounted at the top of a stack, at any U-space. This issue is unique to units in the top most location as servers or storage information handling systems with a device mounted above the unit are protected by the device mounted above, or by the rail of the unit mounted above.

A system and method are disclosed for providing a top of stack mounting component which addresses these issues.

Figure 1:
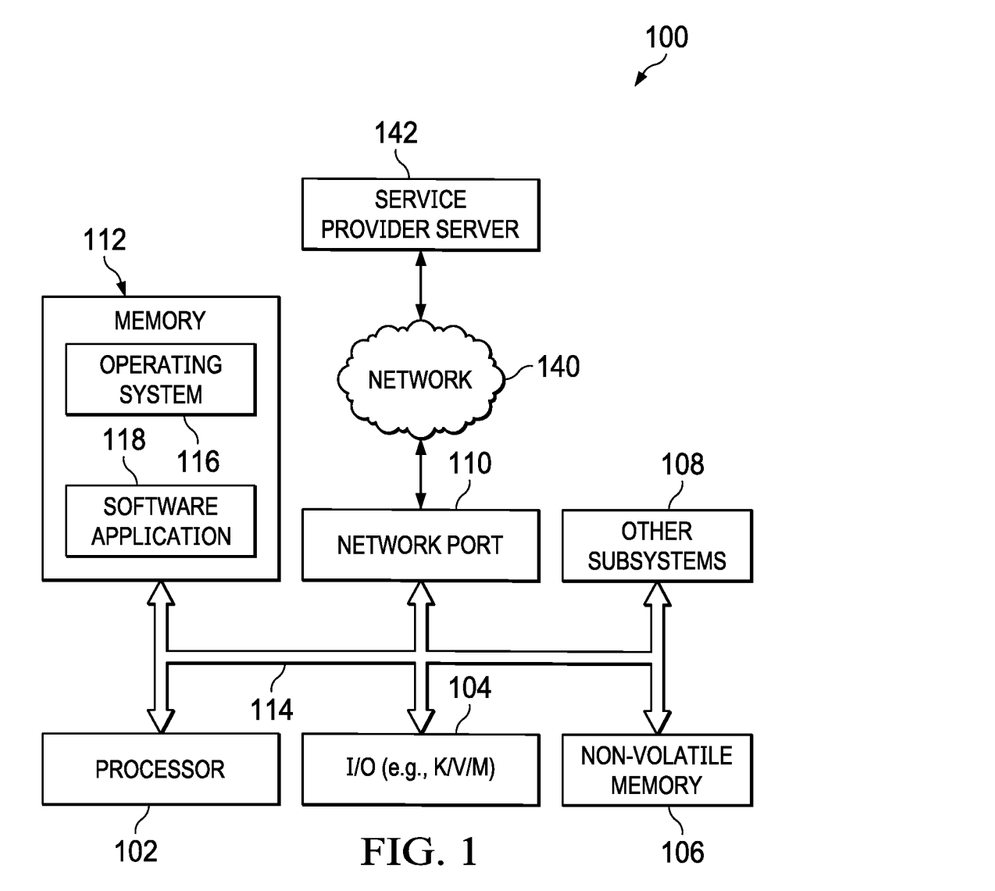
FIG. 1 shows a general illustration of components of an information handling system as implemented in the system and method of the present invention.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center.

Figure 2:
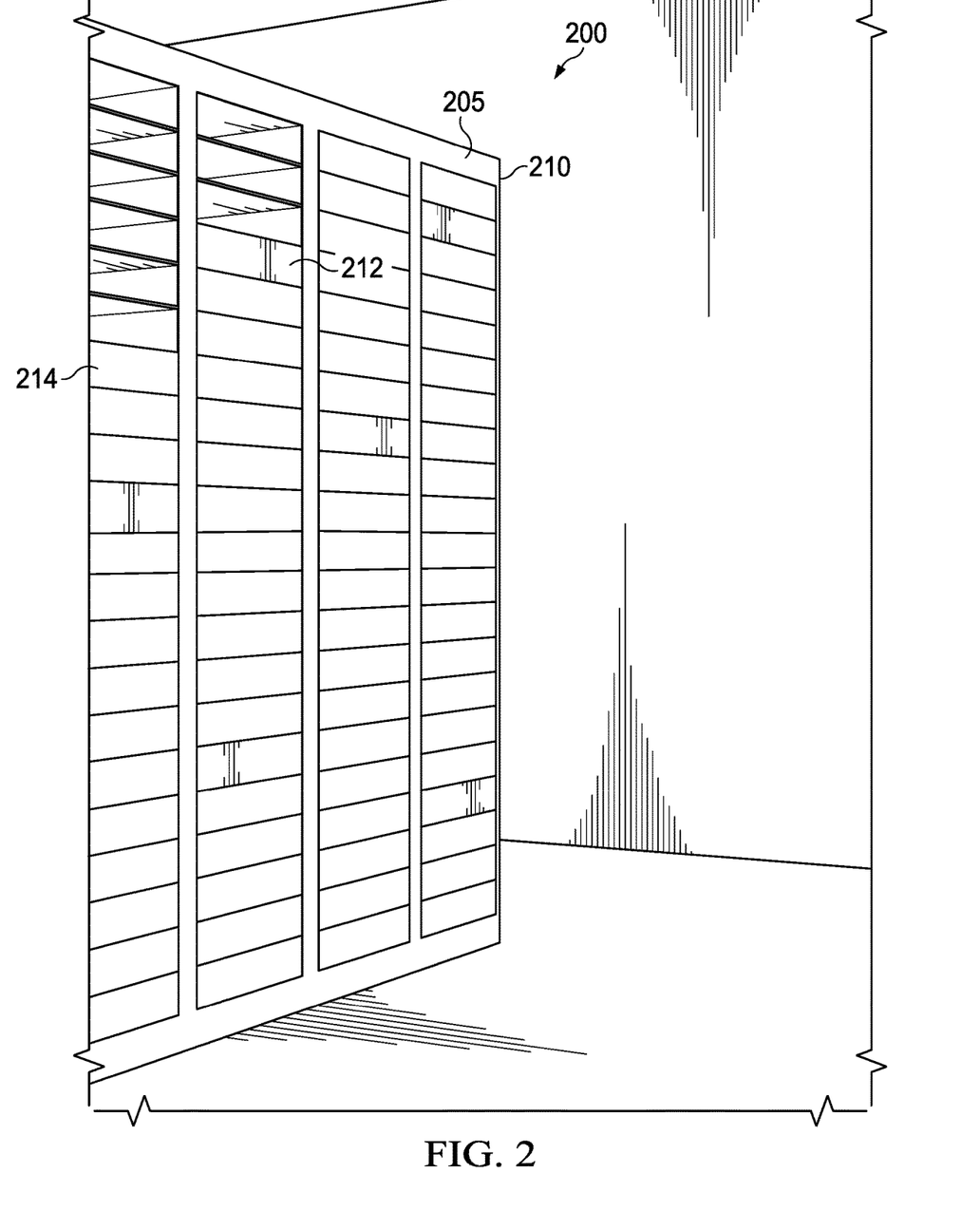
FIG. 2 shows a perspective view of a portion of a data center within an IT environment.

FIG. 2 shows a perspective view of a portion of an IT environment 200. The IT environment includes a one or more racks 205 which includes a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

Each respective rack includes a plurality of vertically arranged information handling systems. The top most information handling system in each rack is the top of stack information handling system 210, 212, 214. In various embodiments, the top of stack information handling system may be located in the top most slot of the rack (see e.g., information handling system 210 or may be mounted in a slot that is other than the top most slot (see e.g., information handling systems 212, 214). In certain embodiments, information handling systems other than the top most information handling systems are mounted to the rack via static rails. In certain embodiments, the static rails include L shaped brackets on one or both sides of each information handling system. The physical structure provides equipment placement and orchestration within a data center facility.

In certain embodiments, a plurality of racks are arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Figure 3A:
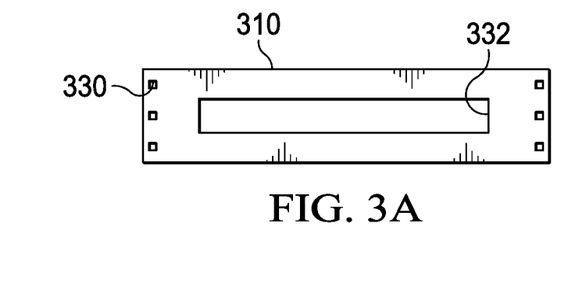
FIGS. 3A and 3B show front and side views of a top of stack mounting component in accordance with an embodiment of the present disclosure.
Figure 3B:
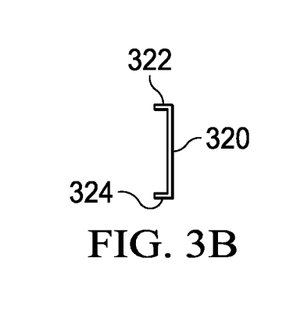

FIGS. 3A and 3B show front and side views of a top of stack mounting component in accordance with an embodiment of the present disclosure. More specifically, the top of stack mounting component 310 is configured as a substantially C shaped bracket in this embodiment. The substantially C shaped bracket includes a side portion 320, a top portion 322 and a bottom portion 324, which may also be referred to as a side member, a top member and a bottom member. The top portion 322 and the bottom portion 324 extends substantially perpendicularly (i.e., 90 degrees+/−10%) from the side portion 320 when view from the front. In certain embodiments, the side portion 320 includes a plurality of mounting apertures 330 via which the top of stack mounting component may be attached to a rack. In certain embodiments, the side portion 320 includes an access aperture 332 which could allow side access to an information handling system mounted within a pair of the top of stack mounting components. In certain embodiments, the top portion 322 functions as an information handling system retention member by preventing upward movement of an information handling system as the information handling system is removed from a rack and passes a potential tipping point where more weight of the information handling system is out of the rack as compared to the portion of the weight of the information handling system which is within the rack.

Figure 4A:
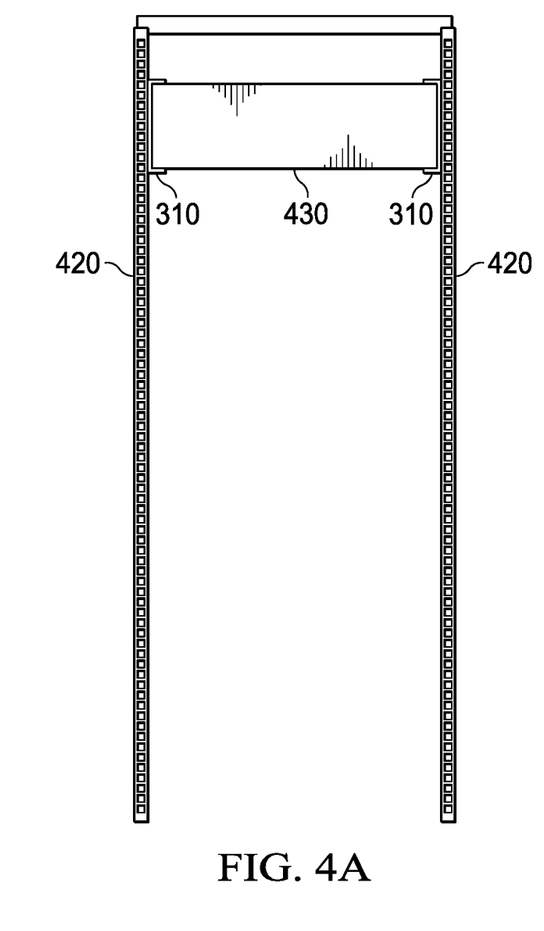
FIGS. 4A, 4B and 4C show a rack front view, a rack side view and a rack side view with an information handling system in an accessible position.
Figure 4B:
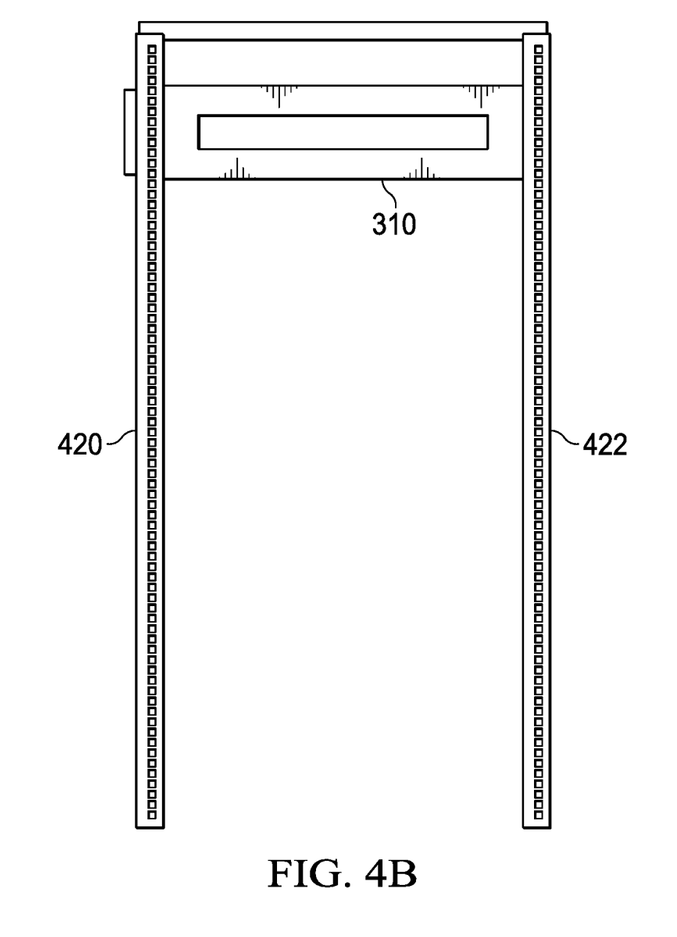
Figure 4C:
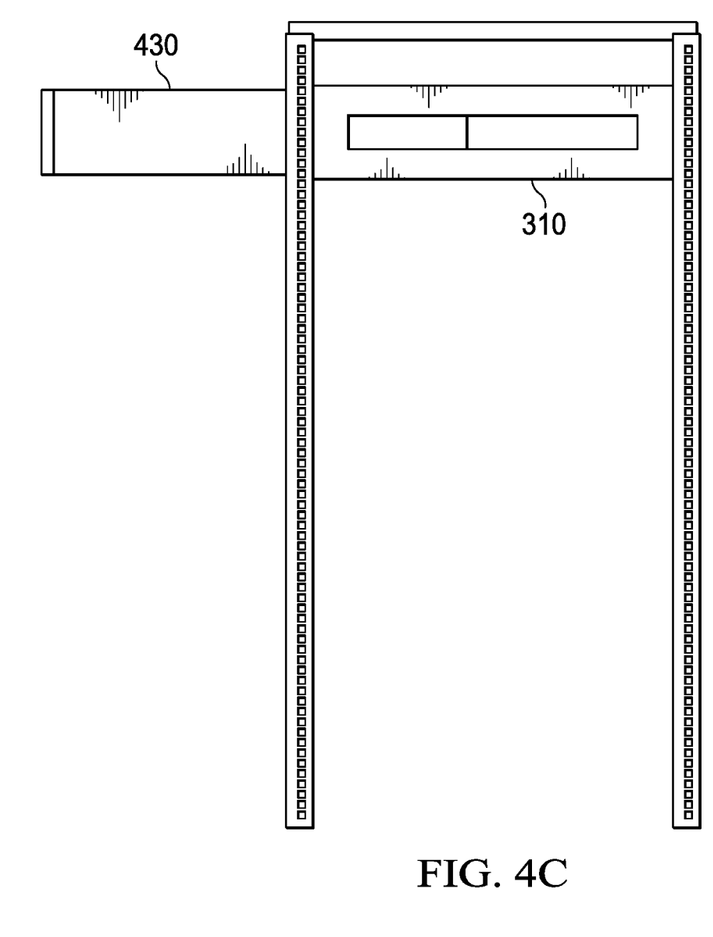

FIGS. 4A, 4B and 4C show a rack front view, a rack side view and a rack side view with an information handling system in an accessible position. A first top of stack mounting component 310 is attached to one side of the rack and a second top of stack mounting component is attached to another side of the rack 410. In certain embodiments, the first top of stack mounting component is attached to a first front side panel 420 and a first rear side panel 422 of the rack 410. In certain embodiments, the second top of stack mounting component is attached to a second front side panel and a second rear side panel. In certain embodiments, the first top of stack mounting component is attached via the mounting apertures 330. In certain embodiments, the second top of stack mounting component is attached via the mounting apertures 330.

Configuring the top of stack mounting component with the top portion 322 adds a second horizontal member as compared with the known L-Rail mounting configuration. This top portion provides a top engagement for the information handling system 430 to prevent upward movement of the rear of the server when the server center of gravity is forward of the rack support such that the information handling system is beyond the tipping point of the extended information handling system (see e.g., FIG. 4C).

Figure 5A:
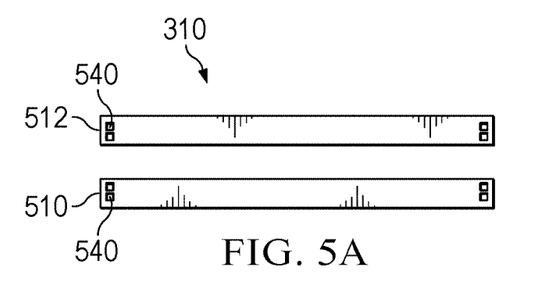
FIGS. 5A and 5B show front and side views of a top of stack mounting component in accordance with another embodiment of the present disclosure.
Figure 5B:
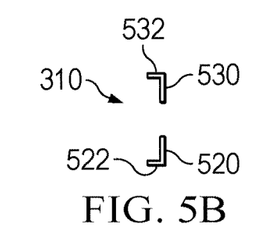

FIGS. 5A and 5B show front and side views of a top of stack mounting component in accordance with another embodiment of the present disclosure. More specifically, the top of stack mounting component 310 is configured as a lower rail 510 and an upper rail 512 in this embodiment. The lower rail includes a side portion 520 and a lower portion 522, which may also be referred to as a side member and a lower member. The upper rail includes a side portion 530 and a top portion 532, which may also be referred to as a side member and a top member. The lower portion 522 and the top portion 532 extend substantially perpendicularly (i.e., 90 degrees+/−10%) from respective side portions 520, 530, respectively. In certain embodiments, the side portion 520 includes a plurality of mounting apertures 540 via which the top of stack mounting component may be attached to a rack. In certain embodiments, the side portion 530 includes a plurality of mounting apertures 540 via which the top of stack mounting component may be attached to a rack. In certain embodiments, the upper rail 512 is simply an L bracket which is mounted to the rack in an upside down orientation. In certain embodiments, the top portion 522 of the upper rail functions as an information handling system retention member by preventing upward movement of an information handling system as the information handling system is removed from a rack and passes a potential tipping point where more weight of the information handling system is out of the rack as compared to the portion of the weight of the information handling system which is within the rack.

Figure 6A:
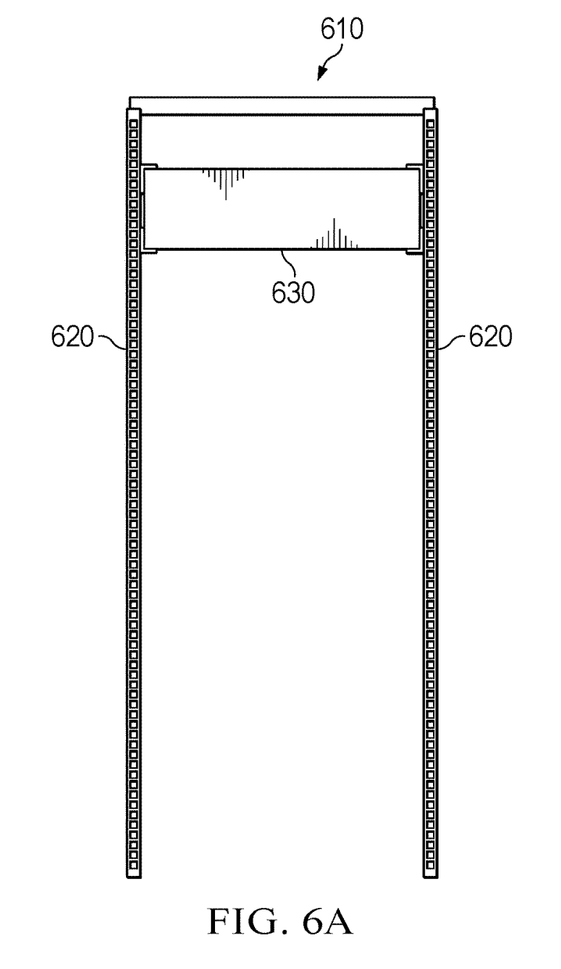
FIGS. 6A, 6B and 6C show a rack front view, a rack side view and a rack side view with an information handling system in an accessible position.
Figure 6B:
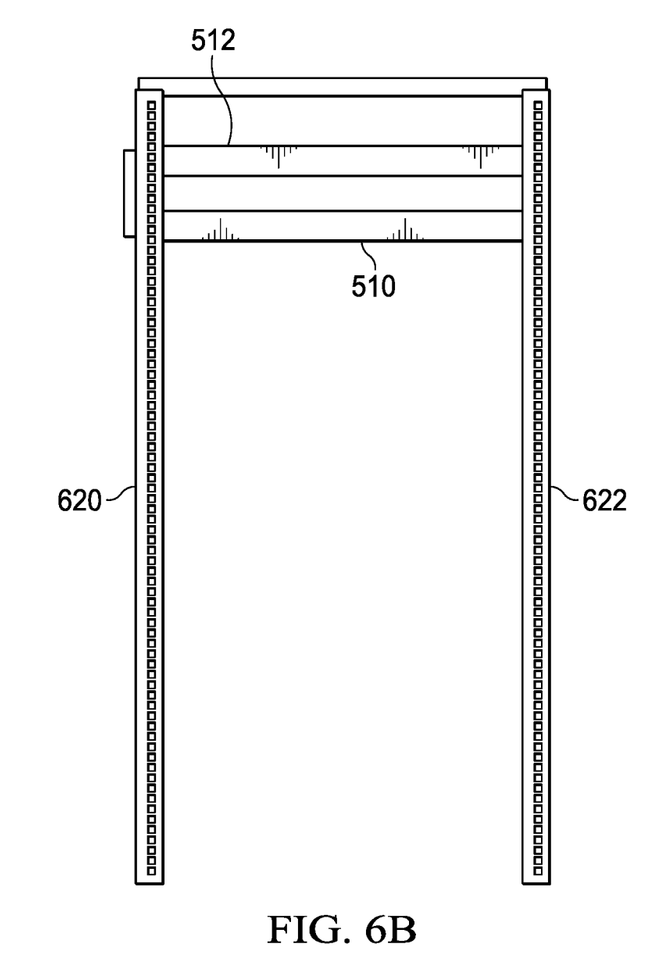
Figure 6C:
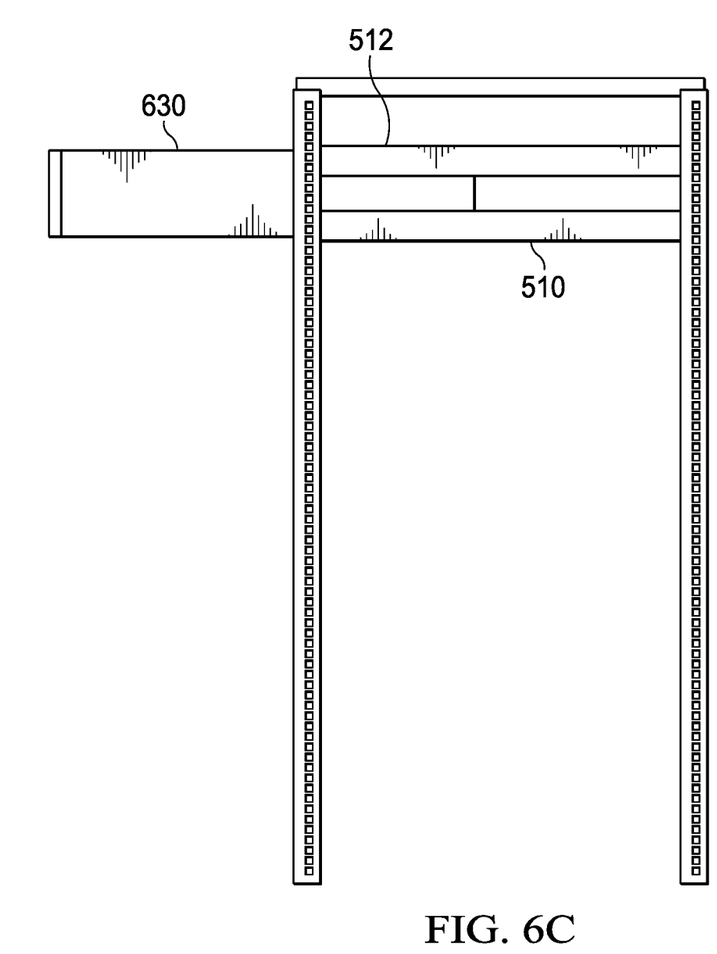

FIGS. 6A, 6B and 6C show a rack front view, a rack side view and a rack side view with an information handling system in an accessible position. A first top of stack mounting component 510 is attached to one side of the rack and a second top of stack mounting component is attached to another side of the rack 510. More specifically, a first lower rail and a first upper rail are attached to one side of the rack and a second lower rail and a second upper rail are attached to another side of the rack. In certain embodiments, the first top of stack mounting component is attached to a first front side panel 620 and a first rear side panel 622 of the rack 610. In certain embodiments, the second top of stack mounting component is attached to a second front side panel and a second rear side panel. In certain embodiments, the first top of stack mounting component is attached via the mounting apertures 540. In certain embodiments, the second top of stack mounting component is attached via the mounting apertures 540.

Configuring the top of stack mounting component with a lower rail and an upper rail enables the upper rail to engage the top of the information handling system 630 to counter the upward tipping forces. Additionally, using a separate lower rail and upper rail allows the upper rail to be mounted further apart to accommodate larger U-height information handling systems (i.e., information handling systems having different vertical sizes), without having to design for specific U-height.

Figure 7A:
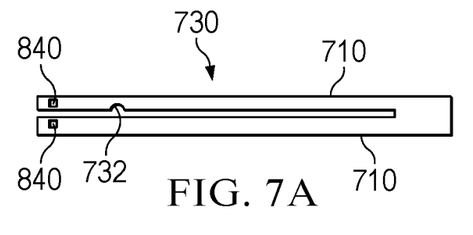
FIGS. 7A and 7B show front and side views of a top of stack mounting component in accordance with another embodiment of the present disclosure.
Figure 7B:
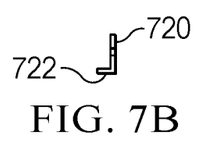
Figure 7C:
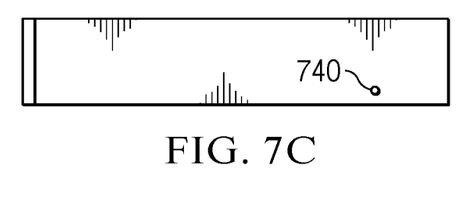
FIG. 7C shows a side view of an information handling system configured to interact with the top of stack mounting component.

FIGS. 7A and 7B show front and side views of a top of stack mounting component in accordance with another embodiment of the present disclosure. FIG. 7C shows a side view of an information handling system configured to interact with the top of stack mounting component. More specifically, the top of stack mounting component 710 is configured as a substantially L shaped bracket in this embodiment. The substantially L shaped bracket includes a side portion 720 and a bottom portion 722, which may also be referred to as a side member and a bottom member. The bottom portion 722 extends perpendicularly from the side portion 720 when viewed from the front. The side portion 720 defines a slotted rail 730. In certain embodiments, the slotted rail includes a catch indentation 732 (i.e., a notch). In certain embodiments, the side portion 720 includes a plurality of mounting apertures 840 via which the top of stack mounting component may be attached to a rack. In certain embodiments, an information handling system includes a rail guide 750 (e.g., a pin) which is configured to interact with the slotted rail 730. In certain embodiments, the slotted rail 730 and the rail guide 750 function as an information handling system retention member by preventing upward movement of an information handling system as the information handling system is removed from a rack and passes a potential tipping point where more weight of the information handling system is out of the rack as compared to the portion of the weight of the information handling system which is within the rack.

In operation, the rail guide moves along the slotted rail as the information handling system is removed from the rack. As the information handling system is removed from the rack, the information handling system tips forward in a controlled manner, causing the pin to catch in the notch, thus providing the technician with feedback to re-support the system for a final removal. If the technician has provided enough support to bypass the notch, the server will continue to slide forward unabated, but with sufficient support, reducing the risk of dropping the server.

Figure 8A:
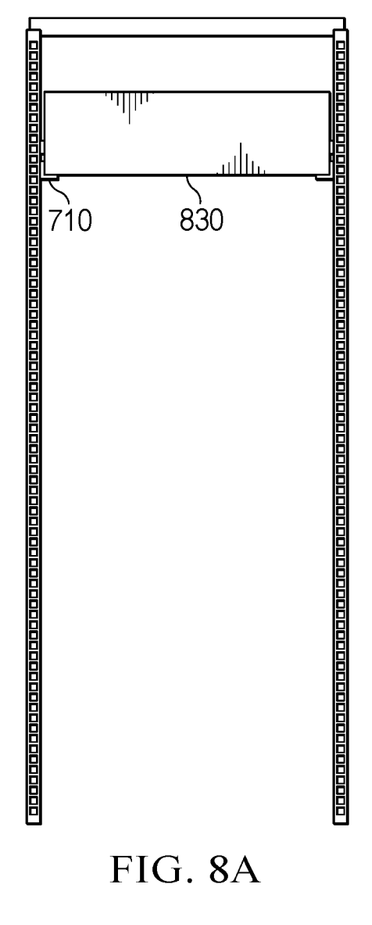
FIGS. 8A, 8B and 8C show a rack front view, a rack side view and a rack side view with an information handling system in an accessible position.
Figure 8B:
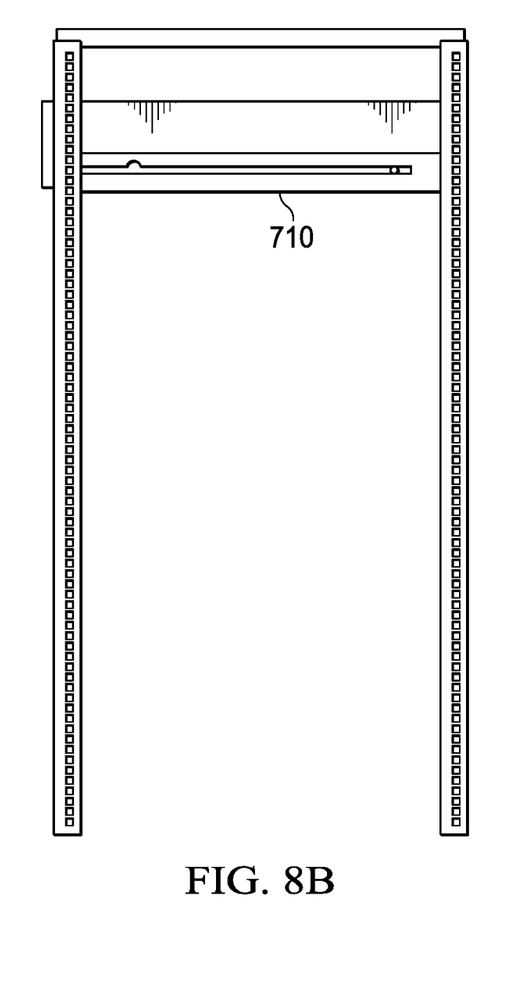
Figure 8C:
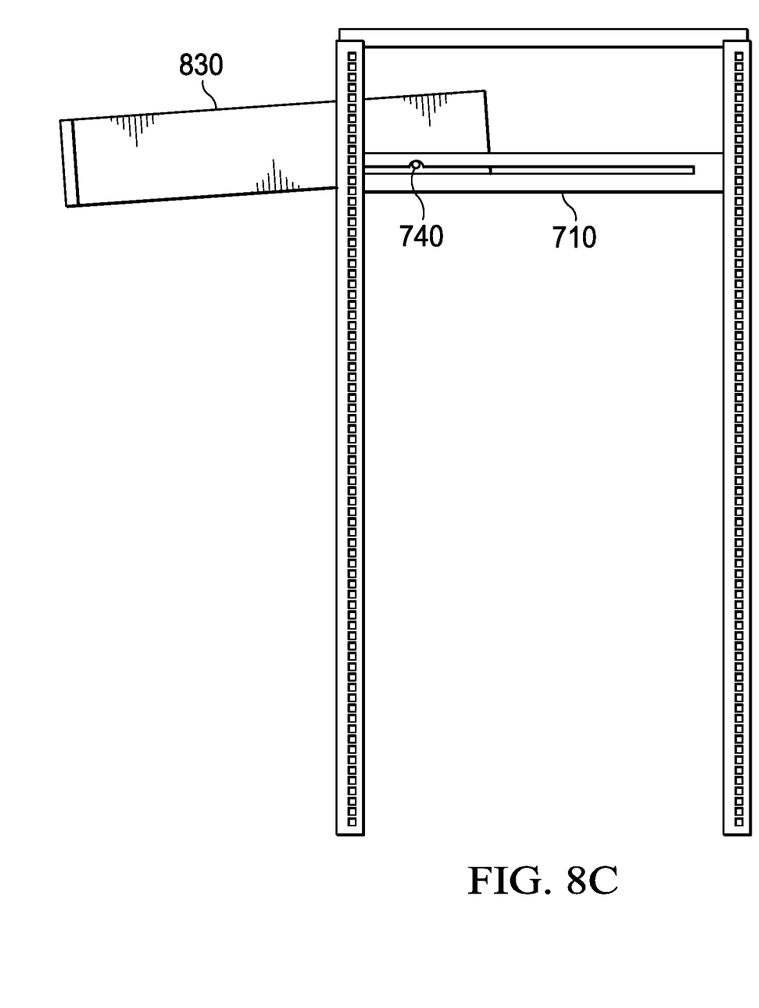

FIGS. 8A, 8B and 8C show a rack front view, a rack side view and a rack side view with an information handling system in an accessible position. A first top of stack mounting component 710 is attached to one side of the rack and a second top of stack mounting component is attached to another side of the rack 410. In certain embodiments, the first top of stack mounting component is attached to a first front side panel 820 and a first rear side panel 822 of the rack 810. In certain embodiments, the second top of stack mounting component is attached to a second front side panel and a second rear side panel. In certain embodiments, the first top of stack mounting component is attached via the mounting apertures 840. In certain embodiments, the second top of stack mounting component is attached via the mounting apertures 840. Configuring the top of stack mounting component with the rail guide that moves along the slotted rail enables the slotted rail to engage the rail guide of the information handling system 630 to counter any upward tipping forces of the information handling system 830.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A top of stack mounting component, comprising:
a side portion, the side portion being configured to be mounted to a side of a rack, the side portion defining a mounting aperture via which the top of stack mounting component can be attached to a front side panel of the rack; and,
an information handling system retention member, the information handing system retention member preventing upward movement of an information handling system as the information handling system is removed from the rack and passes a potential tipping point where more weight of the information handling system is out of the rack as compared to the portion of the weight of the information handling system which is within the rack; and wherein
the side portion and the information handling system retention member are formed from a single piece of material; and,
the top of stack mounting component is positioned in the rack only at a top most information handling system mounting location of the rack.

2. The top of stack mounting component of claim 1, wherein:
the information handling system retention member includes a top portion, the top portion extending substantially perpendicularly from the side portion.

3. The top of stack mounting component of claim 2, further comprising:
a bottom portion, the bottom portion extending substantially perpendicularly from the side portion.

4. The top of stack mounting component of claim 2, wherein:
the information handling system retention member comprises a second side portion; and,
a lower portion, the lower portion extending substantially perpendicularly from the second side portion.

5. The top of stack mounting component of claim 1, wherein:
the information handling system retention member comprises a slotted rail; and,
the information handling system comprises a rail guide, the rail guide moving along the slotted rail as the information handling system is removed from the rack.

6. The top of stack mounting component of claim 5, wherein:
the slotted rail includes a catch indentation, the rail guide catching in the catch indentation as the information handling system is removed from the rack.

7. A rack comprising:
a first side panel and a second side panel;
a top panel attached to the first side panel and the second side panel;
a bottom panel attached to the first side panel and the second side panel; and,
a top of stack mounting component, the top of stack mounting component being positioned in the rack only at a top most information handling system mounting location, the top of stack mounting component comprising:
a side portion, the side portion being configured to be mounted to one of the first side panel and the second side panel of the rack, the side portion defining a mounting aperture via which the top of stack mounting component can be attached to a front side panel of the rack; and,
an information handling system retention member, the information handling system retention member preventing upward movement of an information handling system as the information handling system is removed from the rack and passes a potential tipping point where more weight of the information handling system is out of the rack as compared to the portion of the weight of the information handling system which is within the rack.

8. The rack of claim 7, wherein:
the information handling system retention member includes a top portion, the top portion extending substantially perpendicularly from the side portion.

9. The rack of claim 8, wherein the top of stack mounting component further comprises:
a bottom portion, the bottom portion extending substantially perpendicularly from the side portion.

10. The rack of claim 8, wherein:
the information handling system retention member comprises a second side portion; and,
a lower portion, the lower portion extending substantially perpendicularly from the second side portion.

11. The rack of claim 7, wherein:
the information handling system retention member comprises a slotted rail; and,
the information handling system comprises a rail guide, the rail guide moving along the slotted rail as the information handling system is removed from the rack.

12. The rack of claim 7, wherein:
the slotted rail includes a catch indentation, the rail guide catching in the catch indentation as the information handling system is removed from the rack.

13. The top of stack mounting component of claim 1, wherein:
the information handling system retention member extends from the front side panel of the rack to a rear side panel of the rack.

14. The rack of claim 7, wherein:
the information handling system retention member extends from the first side panel of the rack to the second side panel of the rack.

15. A rack comprising:
a first side panel and a second side panel;
a top panel attached to the first side panel and the second side panel;
a bottom panel attached to the first side panel and the second side panel; and,
a top of stack mounting component, the top of stack mounting component being positioned in the rack only at a top most information handling system mounting location, the top of stack mounting component comprising:
a side portion, the side portion being configured to be mounted to one of the first side panel and the second side panel of the rack, the side portion defining a mounting aperture via which the top of stack mounting component can be attached to a front side panel of the rack; and,
an information handling system retention member, the information handling system retention member preventing upward movement of an information handling system as the information handling system is removed from the rack and passes a potential tipping point where more weight of the information handling system is out of the rack as compared to the portion of the weight of the information handling system which is within the rack; and,
a plurality of static rail mounting components, the plurality of static rail mounting components being positioned in the rack at other than the top most information handling system mounting location.

16. The rack of claim 15, wherein:
the information handling system retention member includes a top portion, the top portion extending substantially perpendicularly from the side portion.

17. The rack of claim 16, wherein the top of stack mounting component further comprises:
a bottom portion, the bottom portion extending substantially perpendicularly from the side portion.

18. The rack of claim 16, wherein:
the information handling system retention member comprises a second side portion; and,
a lower portion, the lower portion extending substantially perpendicularly from the second side portion.

19. The rack of claim 16, wherein:
the information handling system retention member comprises a slotted rail; and,
the information handling system comprises a rail guide, the rail guide moving along the slotted rail as the information handling system is removed from the rack; and,
the slotted rail includes a catch indentation, the rail guide catching in the catch indentation as the information handling system is removed from the rack.

20. The top of stack mounting component of claim 15, wherein:
the information handling system retention member extends from the front side panel of the rack to a rear side panel of the rack.

\* \* \* \* \*